US010020633B2

(12) United States Patent
Tanaka

(10) Patent No.: US 10,020,633 B2
(45) Date of Patent: Jul. 10, 2018

(54) LASER DEVICE

(71) Applicant: FANUC CORPORATION, Yamanashi (JP)

(72) Inventor: Yasuyuki Tanaka, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/649,722

(22) Filed: Jul. 14, 2017

(65) Prior Publication Data

US 2018/0034237 A1    Feb. 1, 2018

(30) Foreign Application Priority Data

Jul. 27, 2016    (JP) .................. 2016-147299

(51) Int. Cl.
*H01S 5/40*    (2006.01)
*H01S 5/022*    (2006.01)
*H01S 5/042*    (2006.01)

(52) U.S. Cl.
CPC ...... *H01S 5/02284* (2013.01); *H01S 5/02252* (2013.01); *H01S 5/02272* (2013.01); *H01S 5/0425* (2013.01); *H01S 5/4012* (2013.01); *H01S 5/4031* (2013.01)

(58) Field of Classification Search
CPC ...... H01S 5/4025–5/426; H01S 5/4012; H01S 5/02284; H01S 5/02252; H01S 5/02208–5/02216; H01S 5/02256; H01S 5/02272; H01S 5/02244; H01L 25/13
See application file for complete search history.

(56) References Cited

U.S. PATENT DOCUMENTS 7,070,418 B1 *    7/2006  Wang ................. F21K 9/00
                                                      439/56
7,795,628 B2 *    9/2010  Ku ..................... F21K 9/00
                                                      257/88
2007/0187709 A1 *  8/2007  Yamamoto ......... H01L 33/483
                                                      257/99

(Continued)

FOREIGN PATENT DOCUMENTS

JP    2007220491 A    8/2007
JP    2011233491 A    11/2011
JP    2013026191 A    2/2013

*Primary Examiner* — Joshua King
(74) *Attorney, Agent, or Firm* — Studebaker & Brackett PC

(57) ABSTRACT

To provide a laser device including an electrically conductive member, which shortens an operation time during electrical connection of laser diode modules, appropriately performs positioning during connection, is highly effective in reducing the number of processes, is highly versatile, and has a simple structure. The laser device includes: a plurality of laser diode modules each including two electrodes; and an electrically conductive member for electrically connecting the electrodes of different ones of the laser diode modules through soldering. The electrically conductive member includes: two electrode insertion portions respectively corresponding to the two electrodes of the laser diode modules; and at least one or more bent portions formed between the two electrode insertion portions, and the electrically conductive member has an overall shape such that a barycenter thereof is located substantially on a straight line that connects the two electrode insertion portions.

4 Claims, 4 Drawing Sheets

(56) References Cited

U.S. PATENT DOCUMENTS

| | | | |
|---|---|---|---|
| 2009/0166661 A1* | 7/2009 | Sheu | H01L 33/62 |
| | | | 257/99 |
| 2012/0044681 A1* | 2/2012 | Lin | F21K 9/00 |
| | | | 362/235 |
| 2015/0229106 A1* | 8/2015 | Yabe | H01S 5/02268 |
| | | | 372/50.12 |
| 2016/0190767 A1* | 6/2016 | Okahisa | H01S 5/02236 |
| | | | 372/43.01 |

* cited by examiner

LASER DEVICE

This application is based on and claims the benefit of priority from Japanese Patent Application No. 2016-147299, filed on 27 Jul. 2016, the content of which is incorporated herein by reference.

BACKGROUND OF THE INVENTION

Field of the Invention

The present invention relates to a laser device, and more specifically relates to a laser device comprising an electrically conductive member that connects laser diode modules.

Related Art

When using an excitation laser diode module for fiber laser, a plurality of laser diode modules need to be electrically connected, in order to fulfill a predetermined output. As a typical method for such connection, an electrically conductive member (sheet metal) is soldered between electrodes of the excitation laser diode modules. During soldering, a soldering iron needs to be strongly pressed against the sheet metal, in order to sufficiently heat the sheet metal. In particular, lead-free solder having a high melting point is poor in workability, requires heat applied for a long time, and may therefore involve a risk of heating and damaging the excitation laser diode modules in some cases. In order to avoid such damage, the soldering needs to be completed within several tens of seconds.

In general, excitation laser diode modules are arranged on a heat dissipation sheet; however, if accuracy in position is not secured in this arrangement, it will fundamentally be difficult to attach the electrically conductive member for connecting the excitation laser diode modules. Further, even if the electrically conductive member could be attached, the required accuracy in attachment position cannot be secured. In this manner, if the required accuracy in attachment position of the electrically conductive member cannot be secured, a distance between the electrically conductive member and the excitation laser diode modules (main body thereof), or a distance between the excitation laser diode module and the optical fiber, cannot be secured. This may alternatively cause another problem in which an insulation distance between the electrically conductive member and the cooling plate cannot be secured. Therefore, a fastening jig has conventionally been used for preventing a sheet metal from tilting or deviating in position when pressing a soldering iron against a sheet metal, in a soldering operation of an electrically conductive member. However, such a jig requires operation time for attachment and detachment, which has been an obstacle to improving the working efficiency in a soldering operation.

Note that various technologies for connecting devices through an electrically conductive member have heretofore been proposed. One of such examples is a technological proposal, in which a battery pack is configured by connecting a plurality of battery cells through an electrically conductive member (bus bar) (for example, refer to Patent Document 1). According to the technology disclosed in Patent Document 1, an electrically conductive member is provided with through holes having a diameter slightly smaller than a diameter of terminals of battery cells, and the through holes are provided with slits in a radial direction. By providing such slits, the through holes are elastically deformed to allow the terminals of the battery cells to be inserted therethrough. Since the electrically conductive member can firmly hold the terminals of the battery cells, the number of processes for terminal connection can be reduced, as compared to conventional connection by fixation with nuts or bolts, according to Patent Document 1.

Further, there has been a proposal of a power supply as well, in which a plurality of battery cells are stacked, and the power supply includes an electrically conductive member (bus bar) for electrically connecting adjacent battery cells through output terminals of the battery cells (for example, refer to Patent Document 2). According to the technology disclosed in Patent Document 2, the output terminals of the battery cells are elastically deformable, and the output terminals are elastically deformed and firmly inserted into connection holes in the electrically conductive member. As a result, positional deviation of the output terminals of the battery cells in relation to the electrically conductive member (bus bar) can be absorbed, and the reliability of connection between the battery cells can be improved, according to Patent Document 2.

Further, there has been a technological proposal of relaxing a stress due to deformation of an electrode terminal member, in which the electrode terminal member is extended from an electrode fixation portion of a transformer, and a tip side thereof is connected to an electronic substrate (for example, refer to Patent Document 3). According to the technology disclosed in Patent Document 3, when a large electric current is applied to the electrode terminal member which is an electrically conductive member, the electrode terminal member generates heat, expands, and creates a stress; and the stress is relaxed by way of a spring action of a member referred to as an absorption protrusion engaged with the electrode terminal member, whereby the stress applied to a soldering portion is suppressed.

Patent Document 1: Japanese Unexamined Patent Application, Publication No. 2011-233491

Patent Document 2: Japanese Unexamined Patent Application, Publication No. 2013-26191

Patent Document 3: Japanese Unexamined Patent Application, Publication No. 2007-220491

SUMMARY OF THE INVENTION

According to the technology disclosed in Patent Document 1, the through holes in the electrically conductive member have a relatively small diameter, and the terminals of the battery cells are inserted into the through holes as elastically deformed. Since the insertion requires adequate pressing force, any significant effect of reducing the number of processes for connecting the electrically conductive member cannot be expected.

The technology disclosed in Patent Document 2 is premised on a specially designed elastically deformable output terminals of battery cells, and can only be realized by combining such special battery cells with a compatible electrically conductive member. Therefore, the technology disclosed in Patent Document 2 lacks versatility.

The technology disclosed in Patent Document 3 indispensably requires a spring action of the member referred to as the absorption protrusion engaged with the electrode terminal member. Therefore, the absorption protrusion that is compatible with the electrode terminal member is indispensably provided, which will complicate the structure.

As discussed above, according to the technologies of Patent Documents 1 to 3, the effects of reducing the number of operations for connecting an electrically conductive member are insufficient, the versatility is poor, and the structure is complicated.

The present has been made against the background as described above, and aims to provide a laser device including an electrically conductive member, which shortens an operation time during electrical connection of laser diode modules, appropriately performs positioning during connection, is highly effective in reducing the number of processes, is highly versatile, and has a simple structure.

(1) The laser device according to a first aspect of the present invention includes: a plurality of laser diode modules (e.g., laser diode modules 12 to be described later) each including two electrodes (e.g., first electrode 12 and second electrode 122 to be described later); and an electrically conductive member (e.g., electrically conductive member 21 to be described later) for electrically connecting the electrodes of different ones of the laser diode modules through soldering, in which the electrically conductive member includes: two electrode insertion portions (e.g., first electrode insertion portion 211 and second electrode insertion portion 212 to be described later) for respectively inserting the two electrodes of the laser diode modules; and at least one or more bent portions (e.g., first bent portion 213 and second bent portion 214 to be described later) formed between the two electrode insertion portions, and the electrically conductive member has an overall shape such that a barycenter thereof (e.g., barycenter G to be described later) is located substantially on a straight line that connects the two electrode insertion portions.

(2) A second aspect of the present invention is the laser device according to the first aspect, in which the two electrodes include a first electrode and a second electrode; the two electrode insertion portions include a first electrode insertion portion and a second electrode insertion portion; the electrically conductive member may be composed of an elongated plate-like member; and a portion thereof crossing the first electrode inserted into the first electrode insertion portion, and a portion thereof crossing the second electrode inserted into the second electrode insertion portion, may be arranged at a predetermined oblique angle in relation to the direction of extending the first electrode and the second electrode of the laser diode modules.

(3) A third aspect of the present invention is the laser device according to the first or second aspect, in which a surface of the electrically conductive member may include a nickel-plated layer.

(4) A fourth aspect of the present invention is the laser device according to any one of the first to third aspects, in which the laser device may further include an oscillating optical fiber (e.g., optical fiber 30 to be described later) arranged such that excitation light from the laser diode modules enters the oscillating optical fiber; and the laser diode modules and the oscillating optical fiber may compose a fiber laser oscillator including them as constituents.

The present invention can embody a laser device including an electrically conductive member, which shortens an operation time during electrical connection of laser diode modules, appropriately performs positioning during connection, is highly effective in reducing the number of processes, is highly versatile, and has a simple structure.

DETAILED DESCRIPTION OF THE INVENTION

Figure 1:
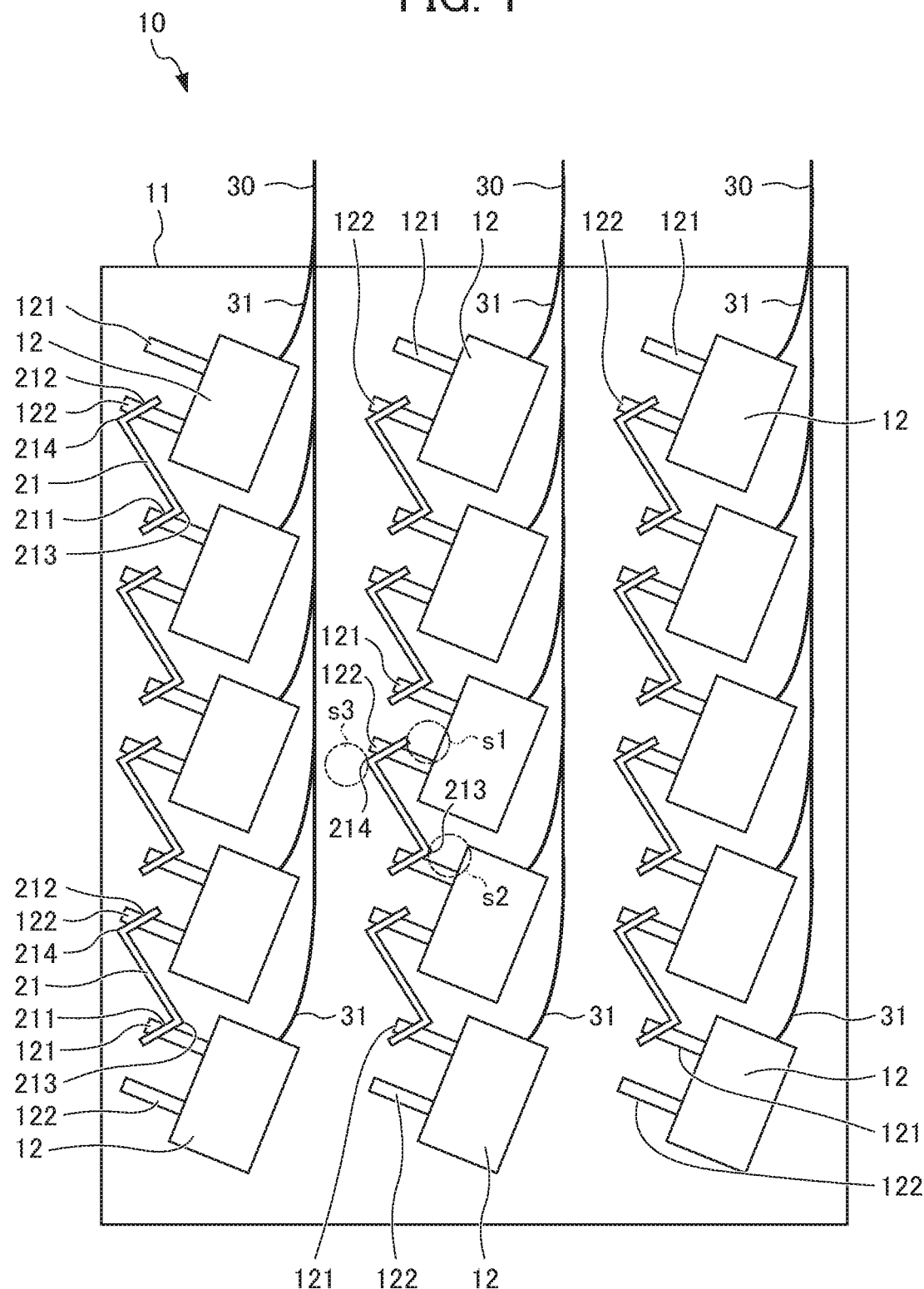
FIG. 1 is a schematic configuration diagram illustrating a laser device according to an embodiment of the present invention.

FIG. 1 is a schematic configuration diagram illustrating a laser device according to an embodiment of the present invention. A laser device 10 of the present example has a plurality of laser diode modules 12 arranged on a cooling plate 11. Each laser diode module 12 is attached to the cooling plate 11 by using, for example, a thermally conductive adhesive or the like. In the depicted example, the laser diode modules 12 are arranged in three lines, each line having five modules in tandem, in which the laser diode modules 12 in each line are serially-connected. An excitation light fiber 31 is arranged correspondingly to each laser diode module 12 in each line. Each excitation light fiber 31 is optically coupled to a corresponding laser diode module 12 in a positional relationship such that light emitted from the laser diode module 12 enters the excitation light fiber 31 at a predetermined angle. Light entering each excitation light fiber 31 is led to an optical fiber 30 in each line through a light combiner (not illustrated). According to the laser device 10 of the present example, the optical fiber 30 composes an oscillating optical fiber for generating oscillation by condensing the light entering from the excitation light fiber 31, which is arranged such that the excitation light from the laser diode module 12 enters the excitation light fiber 31. Namely, the laser diode module 12 and the oscillating optical fiber 30 compose a fiber laser oscillator including themselves as constituents. In FIG. 1, five laser diode modules 12 in each line are arranged in tandem, and each of the laser diode modules 12 has two pin-shaped electrodes. Herein, of the two electrodes, an electrode (for example, anode) having one of the two polarities is referred to as a first electrode 121, and another electrode (for example, cathode) having the other polarity is referred to as a second electrode 122.

As illustrated, the first electrode 121 of one laser diode module 12 is connected to the second electrode 122 of the other laser diode module 12 via an electrically conductive member 21; in this manner, a serially-connected set including a series of five laser diode modules 12 is composed. A power supply circuit (not illustrated) supplies power to the first electrode 121 at one end side (upper end side in FIG. 1) of the serially-connected set, and to the second electrode 122 at the other end side (lower end side in FIG. 1) of the serially-connected set.

Each electrically conductive member 21 includes: two electrode insertion portions (to be described later) respectively corresponding to the first electrode 121 and the second electrode 122 of the laser diode module 12; and at least one or more bent portions formed between the two electrode insertion portions. In the example of FIG. 1, a first bent portion 213 and a second bent portion 214 are formed between the two electrode insertion portions. The first bent portion 213 and the second bent portion 214 are formed by bending one end side and the other end side of the electrically conductive member 21 in opposite directions, in which the electrically conductive member 21 was a rectangular conductor plate before bending. Specifically, in relation to a relatively long central portion of the electrically conductive member 21, a relatively short portion continuous with one end side of the central portion is bent clockwise at a substantially right angle, whereby the first bent portion 213 is formed. In a similar manner, a relatively short portion continuous with the other end side of the central portion is bent anticlockwise at a substantially right angle, whereby the second bent portion 214 is formed.

On the other hand, the outer envelope of each laser diode module 12 is substantially rectangular in a front view, and the corresponding long sides (short sides) thereof are in parallel but not aligned on a straight line, namely, obliquely arranged on the substantially square cooling plate 11. As a result, when the light emitted from each laser diode module 12 enters a corresponding excitation light fiber 31 at a predetermined angle, the excitation light fiber 31 requires less bending, and the excitation light fiber 31 can be effortlessly laid in a limited space. Further, the electrically conductive member 21 includes: two electrode insertion portions 211 and 212 respectively corresponding to the two electrodes (the first electrode 121 and the second electrode 122) of the laser diode module 12; and at least one or more bent portions (the first bent portion 213 and the second bent portion 214) formed between the two electrode insertion portions 211 and 212, in which the electrically conductive member 2 has an overall shape such that the barycenter of the electrically conductive member 21 is substantially located on the straight line that connects the two electrode insertion portions 211 and 212. The barycenter can be further easily understood by referring to embodiments in FIGS. 2 and 3 to be described later.

In FIG. 1, among the three lines of serially-connected sets each including five laser diode modules 12, an electrically conductive member 21 that connects the laser diode modules 12 in the center line is depicted with circles s1, s2, s3 with an alternate long and short dash line. The circles conceptually illustrate space secured between the electrically conductive member 21 and the peripheral portion thereof, in which the first bent portion 213 and the second bent portion 214 are formed, which will be described later.

Figure 2:
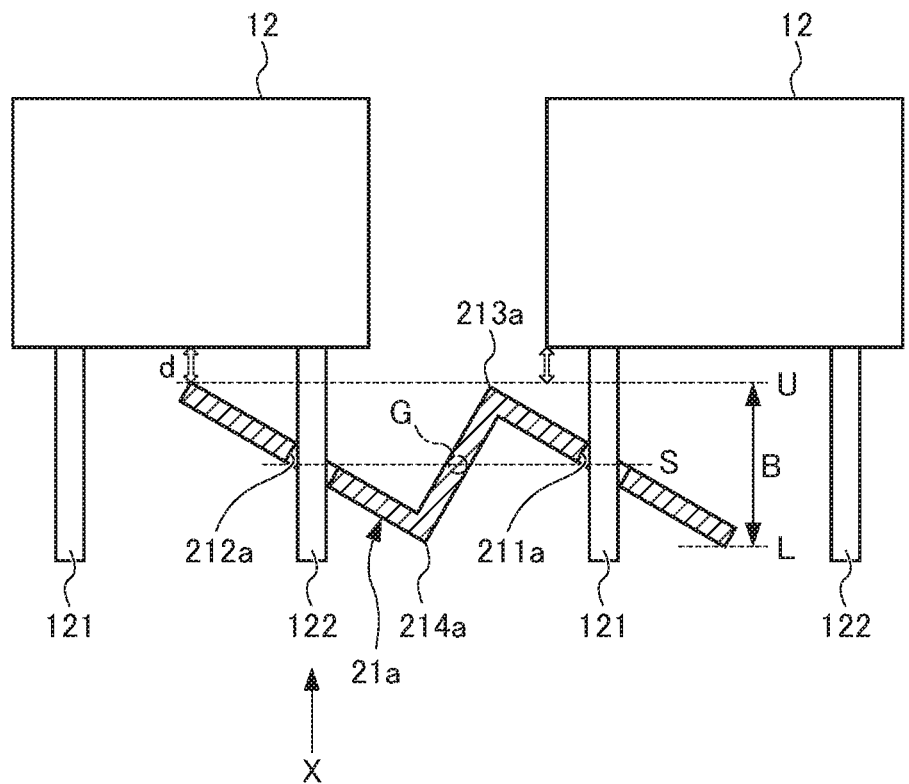
FIG. 2 is a diagram illustrating an aspect of connecting two laser diodes with an electrically conductive member, in a laser device according to another embodiment of the present invention.
Figure 3:
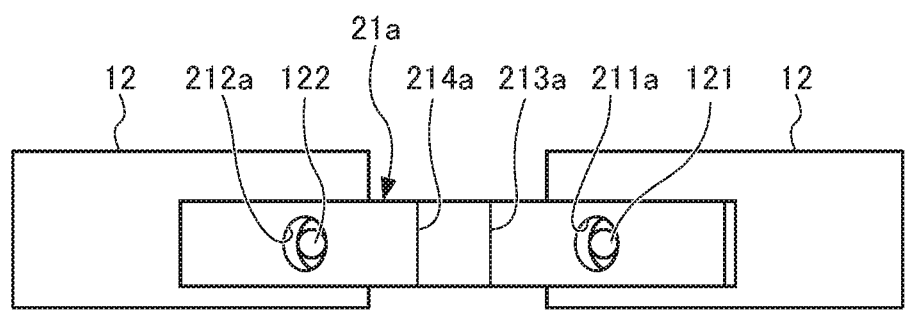
FIG. 3 is a diagram, in which the two laser diodes and the electrically conductive member of FIG. 2 are laterally viewed.

Next, the electrically conductive member 21 is further described with reference to FIGS. 2 and 3 together. FIG. 2 is a diagram illustrating an aspect of connecting two laser diodes with an electrically conductive member in relation to a laser device according to another embodiment of the present invention. FIG. 3 is a diagram, in which the two laser diodes and the electrically conductive member of FIG. 2 are laterally viewed in the direction of the arrow X. In FIGS. 2 and 3, the outer envelope of each laser diode module 12 is substantially rectangular in a front view, and the corresponding long sides thereof are aligned on a straight line, in an arrangement different from the oblique arrangement described with reference to FIG. 1.

In FIGS. 2 and 3, a serially-connected set includes a plurality of laser diode modules being serially connected as described above with reference to FIG. 1, and an aspect of electrical connection thereof is similar to FIG. 1. In order to describe an electrically conductive member 21a, FIGS. 2 and 3 representatively illustrate a portion where the two adjacently arranged laser diode modules 12 are connected via the electrically conductive member 21a, in relation to a serially-connected set as described above, and illustrations of other portions are omitted herein.

Of the two adjacently arranged laser diode modules 12, the second electrode 122 of one laser diode module 12 (the left side in the drawing) and the first electrode 121 of the other laser diode module 12 (the right side in the drawing) are electrically connected via the electrically conductive member 21a. The electrically conductive member 21a is provided with: a first electrode insertion portion 211a composing a hole for inserting the first electrode 121 of the laser diode module 12; and a second electrode insertion portion 212a composing a hole for inserting the second electrode 122. Further, two bent portions, i.e. a mountain-fold first bent portion 213a and a valley-fold second bent portion 214a, are formed between the first electrode insertion portion 211a and the second electrode insertion portion 212a of the electrically conductive member 21a. Here, "mountain fold" is a manner of bending, so as to protrude in the direction towards the outer envelope of the laser diode module 12. "Valley fold" is a manner of bending, so as to protrude in the direction away from the outer envelope of the laser diode module 12. The definition of the terms "mountain fold" and "valley fold" will remain the same in the following description.

The first bent portion 213a and the second bent portion 214a are formed by bending one end side and the other end side of the electrically conductive member 21a in opposite directions, in which the electrically conductive member 21a was a rectangular conductor plate before bending. Specifically, in relation to a relatively short central portion of the electrically conductive member 21a, a relatively long portion continuous with one end side of the central portion is bent clockwise at a substantially right angle, whereby the first bent portion 213a is formed. In a similar manner, another relatively long portion continuous with the other end side of the central portion is bent anticlockwise at a substantially right angle, whereby the second bent portion 214a is formed.

The electrically conductive member 21a as described above has an overall shape such that the position of barycenter G thereof is located substantially on a straight line S that connects the centers of the holes of the first electrode insertion portion 211a and the second electrode insertion portion 212a. Further, in a soldering operation, FIG. 2 illustrates the state in which the two electrodes of the laser diode module 12, i.e. the first electrode 121 and the second electrode 122, have been inserted into the two electrode insertion portions, i.e. the first electrode insertion portion 211a and the second electrode insertion portion 212a of the tabular electrically conductive member 21a, respectively. Further, as is clearer from FIG. 2, the electrically conductive member 21a is composed of an elongated plate-like member; and a portion thereof crossing the first electrode 121 of the first electrode insertion portion 211a, and a portion thereof crossing the second electrode 122 of the second electrode insertion portion 212a, are arranged at a predetermined oblique angle in relation to the direction of extending the first electrode 121 and the second electrode 122 of the laser diode module.

Figure 4:
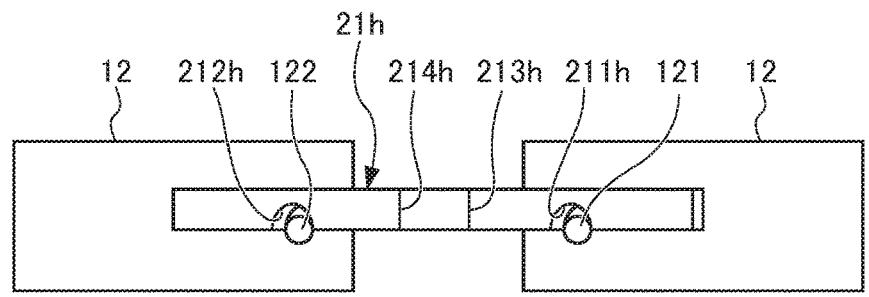
FIG. 4 is a diagram illustrating an electrically conductive member according to another embodiment.

Referring now to FIG. 4, an electrically conductive member according to a further different embodiment is described. FIG. 4 is a diagram illustrating an electrically conductive member according to an embodiment different from FIGS. 2 and 3. In FIG. 4, members corresponding to the members already described in FIG. 3 are assigned with the same reference numbers, and a detailed description of such members is omitted. As can be easily understood in comparison with FIG. 3, simply described, an electrically conductive member 21h of FIG. 4 has a shape composed of an upper half of the electrically conductive member 21a of FIG. 3. Here, the upper half means the half on the near side when the cooling plate 11 arranged with the laser diode modules 12 (refer to FIG. 1) is observed from the front side. Therefore, in relation to the electrically conductive member 21h of FIG. 4, each hole of a first electrode insertion portion 211h and a second electrode insertion portion 212h, which respectively correspond to the first electrode insertion portion 211a and the second electrode insertion portion 212a of FIGS. 2 and 3, has a semi-circular shape in the lateral view as illustrated. Therefore, in a precise sense, the expression that the first electrode 121 and the second electrode 122 of the laser diode module 12 are "inserted" into the first electrode insertion portion 211h and the second electrode insertion portion 212h may not be suitable in a typical sense of the term "insert". In the present specification, for convenience sake, the term "electrode insertion portion" is also applied to the embodiment in FIG. 4.

Figure 5:
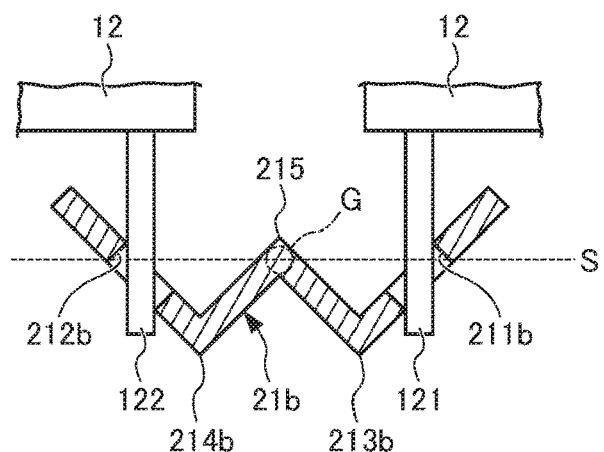
FIG. 5 is a diagram illustrating an electrically conductive member according to a still another embodiment.

Referring now to FIG. 5, an electrically conductive member according to a further different embodiment is described. FIG. 5 is a diagram illustrating an electrically conductive member according to a still another embodiment different from FIGS. 2 and 3. In FIG. 5, members corresponding to the members already described in FIG. 2 are assigned with the same reference numbers, and a detailed description of such members is omitted. The electrically conductive member 21a of FIG. 2 described above has two bent portions, i.e. the first bent portion 213a and the second bent portion 214a, formed between the first electrode insertion portion 211a and the second electrode insertion portion 212a; whereas an electrically conductive member 21b of FIG. 5 has three bent portions, which is a difference.

Namely, the electrically conductive member 21b has two valley-fold bent portions, i.e. a first bent portion 213b and a second bent portion 214b, between the first electrode insertion portion 211b and the second electrode insertion portion 212b. Furthermore, a mountain-fold central bent portion 215 is provided between the first bent portion 213b and the second bent portion 214b. As a result, the electrically conductive member 21b is substantially W-shaped in a lateral view, as illustrated. Further, the electrically conductive member 21b has an overall shape such that the barycenter G thereof is located substantially on a straight line S that connects the first electrode insertion portion 211b and the second electrode insertion portion 212b. Further, the electrically conductive member 21b of FIG. 5 is also composed of an elongated plate-like member; and a portion thereof crossing the first electrode 121 of the first electrode insertion portion 211b, and a portion thereof crossing the second electrode 122 of the second electrode insertion portion 212b, form a predetermined oblique angle in relation to the direction of extending the two electrodes 121 and 122 of the laser diode module.

Figure 6:
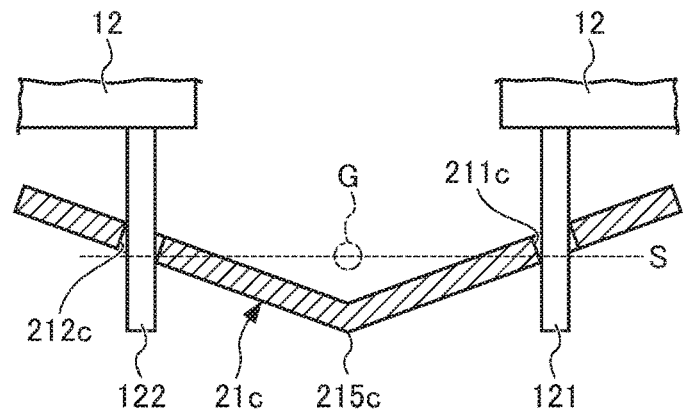
FIG. 6 is a diagram illustrating an electrically conductive member according to a yet another embodiment.

Referring now to FIG. 6, an electrically conductive member according to a further different embodiment is described. FIG. 6 is a diagram illustrating an electrically conductive member according to a still another embodiment different from FIGS. 4 and 5. In FIG. 6, members corresponding to the members already described in FIG. 2 are assigned with the same reference numbers, and a detailed description of such members is omitted. The electrically conductive member 21a of FIG. 2 described above has two bent portions, i.e. the first bent portion 213a and the second bent portion 214a, formed between the first electrode insertion portion 211a and the second electrode insertion portion 212a; whereas an electrically conductive member 21c of FIG. 6 has one bent portion, which is a difference. Namely, the electrically conductive member 21c has one valley-fold bent portion 215c between a first electrode insertion portion 211c and a second electrode insertion portion 212c. Further, the electrically conductive member 21c has an overall shape such that the barycenter G thereof is located substantially on a straight line S that connects the first electrode insertion portion 211c and the second electrode insertion portion 212c. Further, the electrically conductive member 21c of FIG. 6 is also composed of an elongated plate-like member; and a portion thereof crossing the first electrode 121 of the first electrode insertion portion 211c, and a portion thereof crossing the second electrode 122 of the second electrode insertion portion 212c, form a predetermined oblique angle in relation to the direction of extending the two electrodes 121 and 122 of the laser diode module.

Next, in relation to the embodiment of the present invention described above with reference to FIGS. 1 to 6, operation/working-effects according the embodiment are described by appropriately referring to the drawings for illustrating the operation/working-effects. According to the embodiment of FIGS. 1 to 6, the electrically conductive members 21, 21h, 21a, 21b, 21c share the common capability of forming a predetermined oblique angle in relation to the direction of extending the two electrodes 121 and 122 of the laser diode module 12, in the state in which the two electrodes 121 and 122 of the laser diode module 12 are inserted into the two electrode insertion portions, respectively.

Figure 7:
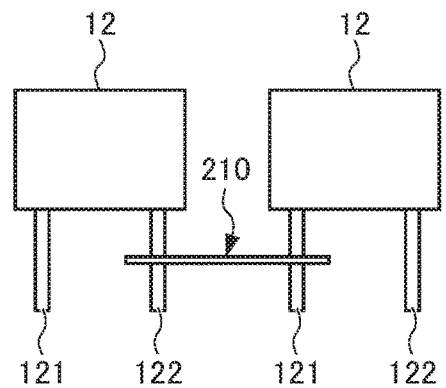
FIG. 7 is a diagram illustrating an embodiment of a virtual electrically conductive member that does not achieve the operation/working-effects of the present invention, for the sake of describing the operation/working-effects of the present invention.

FIG. 7 illustrates an electrically conductive member 210 for comparison in this regard. For the sake of describing the operation/working-effects of the present invention, FIG. 7 is a diagram illustrating an embodiment of a virtual electrically conductive member which does not achieve the operation/working-effects of the present invention. The electrically conductive member 210 of FIG. 7 does not form an oblique angle but intersect at a right angle in relation to the direction of extending the two electrodes 121 and 122 of the laser diode module 12, in the state in which the two electrodes 121 and 122 of the laser diode module 12 are inserted into the two electrode insertion portions, respectively. The electrically conductive member 210 of FIG. 7 is provided in a posture orthogonal to the direction of extending the two electrodes 121 and 122 of the laser diode module, and will therefore easily move. Therefore, the electrically conductive member 210 will move when a force is applied during soldering, and is difficult to be fixed at a predetermined position by soldering.

On the other hand, according to the embodiments of the present invention described above with reference to FIGS. 1 to 6, the insertion of the electrically conductive member (21, 21h, 21a, 21b, 21c) forms a predetermined oblique angle in relation to the direction of extending the two electrodes (121, 122) of the laser diode module 12. Therefore, the hole (inner edge thereof) in the electrode insertion portion (211, 212; 211h, 212h; 211a, 212a; 211b, 212b; 211c, 212c) contacts each corresponding electrode (121, 122), and provides a braking action against the movement of the electrically conductive member (21, 21h, 21a, 21b, 21c).

In particular, if the electrically conductive member (21, 21h, 21a, 21b, 21c) in FIGS. 1 to 6 is composed of an elastic body (for example, sheet metal), and the hole (inner edge thereof) in the electrode insertion portion (211, 212; 211h, 212h; 211a, 212a; 211b, 212b; 211c, 212c) contacts each corresponding electrode (121, 122) with an elastic force, the above-described braking action will be further enhanced. Therefore, according to the embodiments of the present invention described above with reference to FIGS. 1 to 6, the braking action restricts the electrically conductive member (21, 21h 21a, 21b, 21c) at a predetermined position in relation to the two electrodes (121, 122) of the laser diode module 12, and the predetermined position can be maintained against a force applied during soldering.

Note that, as described above, in order for the holes (inner edge thereof) in the electrode insertion portion (211, 212; 211h, 212h; 211a, 212a; 211b, 212b; 211c, 212c) to elastically contact each corresponding electrode (121, 122), the entirety of the electrically conductive member (21, 21h, 21a, 21b, 21c) does not have to be composed of an elastic body. Namely, the bent portion (213, 214; 213h, 214h; 213a, 214a; 213b, 214b; 215c) of the electrically conductive member (21, 21h, 21a, 21b, 21c) is composed of an elastically deformable member, whereby a similar braking action as described above can be obtained.

Therefore, the above-described electrically conductive member (21, 21h, 21a, 21b, 21c) applied to the laser device according to the embodiment of the present invention contributes to shortening the operation time during electrical connection of the laser diode modules, is capable of appropriately performing the positioning during connection, is highly effective in reducing the number of processes, is highly versatile, and has a simple structure.

Further, the electrically conductive member (21, 21h, 21a, 21b, 21c) is composed of an elastic body, and the dimension of the holes in the electrode insertion portion (211, 212; 211h, 212h; 211a, 212a; 211b, 212b; 211c, 212c) is appropriately selected, whereby the position of the electrically conductive member (21, 21h, 21a, 21b, 21c) can be appropriately maintained during soldering, flexibility depending on the variability in the installation position of the laser diode module 12, i.e. the positions of the two electrodes 121 and 122 of the laser diode module 12.

Figure 8:
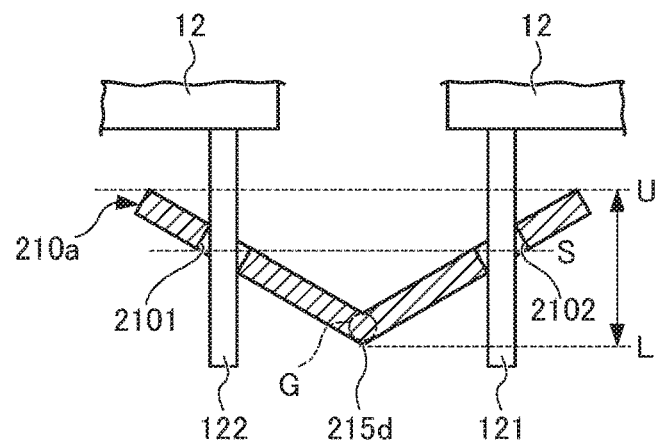
FIG. 8 is a diagram illustrating another embodiment of a virtual electrically conductive member that does not achieve the operation/working-effects of the present invention, for the sake of describing the operation/working-effects of the present invention.

Meanwhile, the embodiments of the present invention described above with reference to FIGS. 1 to 6 are also commonly characterized in that the electrically conductive member (21, 21h, 21a, 21b, 21c) has an overall shape such that the barycenter thereof is located substantially on the straight line that connects the two electrode insertion portions (211, 212; 211h, 212h; 211a, 212a; 211b, 212b; 211c, 212c). FIG. 8 illustrates the electrically conductive member 210 for comparison with this common feature. For the sake of describing the operation/working-effects of the present invention, FIG. 8 is a diagram illustrating another embodiment of the virtual electrically conductive member which does not achieve the operation/working-effects of the present invention. An electrically conductive member 210a of FIG. 8 includes: two electrode insertion portions 2101 and 2102 respectively corresponding to the two electrodes 121 and 122 of the laser diode module 12; and at least one bent portion formed between the two electrode insertion portions 2101 and 2102, which does not differ from the above-described embodiment of FIG. 6. However, the electrically conductive member 210a has an overall shape such that the barycenter G thereof is not located substantially on the straight line S that connects the two electrode insertion portions 2101 and 2102, which differs from any of the embodiments of the present invention described above with reference to FIGS. 1 to 6.

Namely, the electrically conductive member 210a of FIG. 8 has one bent portion 215d, but has a relatively small distance between the upper limit position U and the lower limit position L thereof. Here, the "upper limit position" means a position closest to the outer envelope of the laser diode module 12, and the "lower limit position" means a position most separated from the outer envelope of the laser diode module 12. The above-described definition of the "upper limit position" and "lower limit position" will remain the same in the following description. However, the barycenter G of the electrically conductive member 210a of FIG. 8 is not located on the straight line S that connects the two electrode insertion portions 2101 and 2102, but is located in the vicinity of the above-described lower limit position L. The vertically downward gravity acts on the barycenter G at this position. Therefore, when the barycenter G is at the vertically lowest position in relation to the above-described straight line S serving as an axis, the electrically conductive member 210a will rest at the most stable position. Namely, the electrically conductive member 210a is difficult to remain stationary at an arbitrary rotation angle around the axis. Therefore, the electrically conductive member 210a is difficult to maintain an arbitrary predetermined posture during soldering. Namely, according to the electrically conductive member 210a of FIG. 8, the bent portion 215d at the barycenter G is located at the vertically lowest position, and this portion will protrude towards the cooling plate 11 (refer to FIG. 1). As a result, an insulation distance between the electrically conductive member 210a and the cooling plate 11 will be difficult to be appropriately secured.

In contrast, according to the embodiments of the present invention described above with reference to FIGS. 1 to 6, the electrically conductive member (21, 21h, 21a, 21b, 21c) has the barycenter substantially on the above-described straight line S, and can therefore remain stationary at a rotation angular position within a required range around the axis being the straight line S. Namely, an arbitrary predetermined posture can be maintained during soldering. Therefore, soldering can be performed in a posture in which the bent portion (213, 214; 213h, 214h; 213a, 214a; 213b, 214b; 215c) will not inadvertently approach the cooling plate 11 (refer to FIG. 1). As a result, an insulation distance can be appropriately secured. Based on the description above, the meaning of "substantially" can be understood in accordance with the definition in the present invention, in which the electrically conductive member has an overall shape such that the barycenter thereof is located substantially on the straight line that connects the two electrode insertion portions. In other words, "on the straight line that connects the two electrode insertion portions" means "on the straight line S that connects the centers of the holes of the first electrode insertion portion and the second electrode insertion portion" as described above, and means including the cases where the barycenter is not precisely located on the straight line. If the electrically conductive member has a barycenter sufficiently close to the straight line S and can remain stationary at a rotation angular position within a required range around the axis being the straight line S, the barycenter should be interpreted as being located substantially on the straight line S; and for example, the above-described definition also applies to the case where the barycenter is separated from the straight line S as far as to the edge of each hole of the first electrode insertion portion and the second electrode insertion portion.

Further, according to the electrically conductive member (21, 21h, 21a, 21b, 21c) described above with reference to FIGS. 1 to 6, at least one or more bent portions (213, 214; 213h, 214h; 213a, 214a; 213b, 214b; 215c) are formed between the two electrode insertion portions (211, 212; 211h, 212h; 211a, 212a; 211b, 212b; 211c, 212c). Namely, this feature of the bent portions is also common to the embodiments of the present invention described above with reference to FIGS. 1 to 6.

Figure 9:
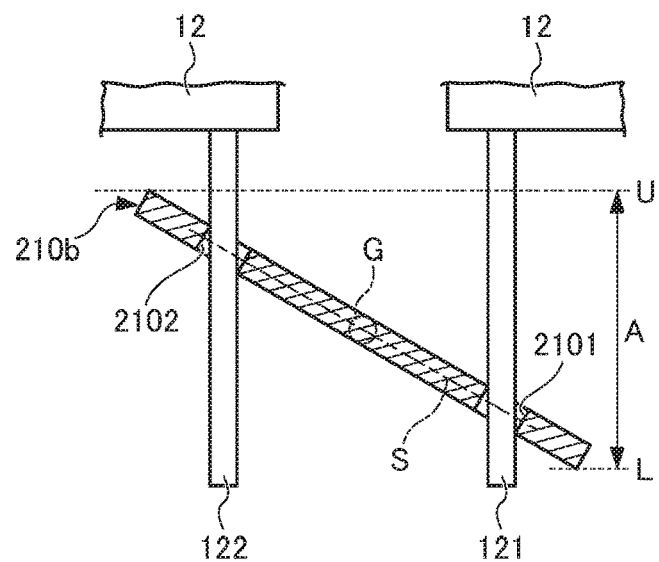
FIG. 9 is a diagram illustrating still another embodiment of a virtual electrically conductive member that does not achieve the operation/working-effects of the present invention, for the sake of describing the operation/working-effects of the present invention.

FIG. 9 illustrates an electrically conductive member for comparison in terms of the feature of bent portions. For the sake of describing the operation/working-effects of the present invention, FIG. 9 is a diagram illustrating still another embodiment of the virtual electrically conductive member which does not achieve the operation/working-effects of the present invention. An electrically conductive member 210b of FIG. 9 forms an oblique angle in relation to the direction of extending the two electrodes 121 and 122 of the laser diode module 12, in the state in which the two electrodes 121 and 122 of the laser diode module 12 are inserted into the two electrode insertion portions 2101 and 2102. Therefore, according to the electrically conductive member 210b of FIG. 9 as well, the hole (inner edge thereof) in the electrode insertion portion 2101 and 2102 contacts each corresponding electrode (121, 122), and provides a braking action against the movement of the electrically conductive member 210b. Therefore, according to the electrically conductive member 210b of FIG. 9, the braking action restricts the electrically conductive member 210b at a predetermined position in relation to the two electrodes (121, 122) of the laser diode module 12, and can resist the force applied during soldering.

However, the electrically conductive member 210b of FIG. 9 does not have any bent portion in the two electrode insertion portions 2101 and 2102. Therefore, the electrically conductive member 210b extends in the direction along the straight line S that connects the two electrode insertion portions 2101 and 2102, and the full length in this direction will be longer than the electrically conductive member (21, 21h, 21a, 21b, 21c) of FIGS. 1 to 6. Therefore, if the electrically conductive member 210b is arranged obliquely in relation to the two electrodes (121, 122) of the laser diode module 12, a distance A between the upper limit position U and the lower limit position L will increase, inhibiting the downsizing of the device. In other words, according to the electrically conductive member 210b of FIG. 9, although the barycenter G is located on the straight line S that connects the two electrode insertion portions 2101 and 2102, which is similar to the electrically conductive member described above with reference to FIGS. 1 to 6, there is a major drawback that the distance A will increase.

In contrast, according to the electrically conductive member (21, 21h, 21a, 21b, 21c) described above with reference to FIGS. 1 to 6, at least one or more bent portions are formed between the two electrode insertion portions. Therefore, as is particularly clear with reference to FIG. 2, even if the electrically conductive member (21a) is arranged obliquely in relation to the two electrodes (121, 122) of the laser diode module 12, the distance B between the upper limit position U and the lower limit position L is smaller than the distance A in FIG. 9, whereby the downsizing of the device is not inhibited. Further, there is an advantage that a gap d between the upper limit position U and the outer envelope of the laser diode module 12 can be sufficiently secured, while maintaining the downsizing of the device. This advantage is common to the electrically conductive member (21, 21h, 21a, 21b, 21c) described above with reference to FIGS. 1 to 6.

In particular, the electrically conductive member 21b described with reference to FIG. 5 is formed into a W-shape as a whole, by including the central bent portion 215 in addition to the first bent portion 213b and the second bent portion 214b. Therefore, there is a prominent effect that the downsizing of the device will not be inhibited, even if the braking action is increased by narrowing the angle (inferior angle) formed by the intersection of the two electrodes (121, 122) of the laser diode module 12.

Note that, according to the electrically conductive member 21c described above with reference to FIG. 6, at least one bent portion is formed between the two electrode insertion portions. Therefore, there is an advantage that the entire configuration is simple.

The laser device 10 of FIG. 1 is taken as an example to describe how the formation of at least one or more bent portions between the two electrode insertion portions of the electrically conductive member (21, 21h, 21a, 21b, 21c) contributes to the downsizing of the laser device. According to the laser device 10 of FIG. 1, as described above, the outer envelope of each laser diode module 12 is substantially rectangular in a front view, and the corresponding long sides (short sides) thereof are in parallel but not aligned on a straight line, namely, obliquely arranged on the substantially square cooling plate 11. As a result, when the light emitted from each laser diode module 12 enters a corresponding excitation light fiber 31 at a prearranged angle, the excitation light fiber 31 requires less bending, and the excitation light fiber 31 can be effortlessly laid in a limited space.

According to the laser device 10 of FIG. 1, in addition to such a configuration, each electrically conductive member 21 further includes the two electrode insertion portions 211 and 212 respectively corresponding to the two electrodes (the first electrode 121 and the second electrode 122) of the laser diode module 12, and the first bent portion 213 and the second bent portion 214 formed between the electrode insertion portions 211 and 212. Therefore, a sufficient space s1 is secured between one end of the electrically conductive member 21, i.e. the proximal end towards the outer envelope of the laser diode module 12 (corresponding to the upper limit position U), and the outer envelope of the laser diode module 12. Therefore, during soldering, the risk of transmitting heat of the heated electrically conductive member 21 to the laser diode module 12 and breaking the laser diode module 12 can be effectively avoided. Moreover, a sufficient space s2 is secured between the first bent portion 213 of each electrically conductive member 21 and the outer envelope of the laser diode module 12. Further, a sufficient space s3 is secured between the second bent portion 214 of each electrically conductive member 21 and the optical fiber 30.

Regarding any of the electrically conductive member (21, 21h, 21a, 21b, 21c) described above with reference to FIGS. 1 to 6, it is possible to recommend an embodiment in which the surface includes a nickel-plated layer by applying a nickel plating treatment to the sheet metal. In this case, the electrically conductive member (21, 21h, 21a, 21b, 21c) will have favorable soldering wettability, the soldering can be completed in a short time, and damage caused by heat input to the laser diode module 12 can be minimized.

In conclusion, the laser device according to the embodiment of the present invention includes the electrically conductive member, which shortens the operation time during electrical connection of the laser diode modules, appropriately performs the positioning during connection, is highly effective in reducing the number of processes, is highly versatile, and has a simple structure.

Note that the present invention is not limited to the above-described embodiments, and can be implemented through transformations or alterations in various ways. For example, in the embodiments described above with reference to FIGS. 1 to 6, the example has been described in which the bent portion (213, 214; 213h, 214h; 213a, 214a; 213b, 214b; 215c) of the electrically conductive member (21, 21h, 21a, 21b, 21c) is formed through a bending process. However, without limitation to this example, it is possible to employ an embodiment in which the bent portion takes a bent shape from the beginning. In addition, transformations or improvements within the range that can achieve the object of the present invention shall be subsumed into the present invention.

EXPLANATION OF REFERENCE NUMERALS

10 laser device

11 cooling plate

12 laser diode module

21, 21a, 21b, 21c electrically conductive member

121 first electrode

122 second electrode

211, 212, 211a, 212a, 211b, 212b electrode insertion portion

213, 214, 213a, 214a, 213b, 214b bent portion

What is claimed is:

1. A laser device comprising: a plurality of laser diode modules each including two electrodes; and an electrically conductive member for electrically connecting the electrodes of different ones of the laser diode modules through soldering, wherein the electrically conductive member includes: two electrode insertion portions for respectively inserting the two electrodes of the laser diode modules; and at least one or more bent portions formed between the two electrode insertion portions, and the electrically conductive member has an overall shape such that a center of mass thereof is located substantially on a straight line that connects the two electrode insertion portions.

2. The laser device according to claim 1, wherein the two electrodes are a first electrode and a second electrode, the two electrode insertion portions are a first electrode insertion portion and a second electrode insertion portion, and the electrically conductive member is composed of an elongated plate-like member; and a portion thereof crossing the first electrode inserted into the first electrode insertion portion, and a portion thereof crossing the second electrode inserted into the second electrode insertion portion, are arranged at a predetermined oblique angle in relation to the direction of extending the first electrode and the second electrode of the laser diode modules.

3. The laser device according to claim 1, wherein a surface of the electrically conductive member includes a nickel-plated layer.

4. The laser device according to claim 1, further comprising an oscillating optical fiber arranged such that excitation light from the laser diode modules enters the oscillating optical fiber, wherein
the laser diode modules and the oscillating optical fiber compose a fiber laser oscillator including them as constituents.

* * * * *